US009659630B2

(12) United States Patent
Jeddeloh

(10) Patent No.: US 9,659,630 B2
(45) Date of Patent: *May 23, 2017

(54) MULTI-MODE MEMORY DEVICE AND METHOD HAVING STACKED MEMORY DICE, A LOGIC DIE AND A COMMAND PROCESSING CIRCUIT AND OPERATING IN DIRECT AND INDIRECT MODES

(75) Inventor: Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/619,682

(22) Filed: Sep. 14, 2012

(65) Prior Publication Data
US 2013/0010552 A1 Jan. 10, 2013

Related U.S. Application Data

(63) Continuation of application No. 12/166,871, filed on Jul. 2, 2008, now Pat. No. 8,289,760.

(51) Int. Cl.
G06F 12/00 (2006.01)
G11C 11/408 (2006.01)
(Continued)

(52) U.S. Cl.
CPC ........ *G11C 11/408* (2013.01); *G06F 13/1694* (2013.01); *G11C 5/02* (2013.01); *G11C 11/4093* (2013.01); *G11C 11/4096* (2013.01)

(58) Field of Classification Search
CPC ......... G11C 7/22; G11C 8/12; G11C 11/4096; G11C 11/408; G11C 11/4093; G11C 5/02; G06F 13/1694
(Continued)

(56) References Cited

U.S. PATENT DOCUMENTS 5,179,303 A 1/1993 Searles et al.
5,263,032 A 11/1993 Porter et al.
(Continued)

FOREIGN PATENT DOCUMENTS

JP 05-265872 10/1993
JP H07-74620 A 5/1995
(Continued)

OTHER PUBLICATIONS

Notice of Preliminary Rejection, NF OA for KR Appl# 1020117002671, Sep. 24, 2012.
International Search Report & Written Opinion dated Feb. 18, 2010 for PCT/US2009/046898.
Extended European Search Report dated Aug. 29, 2011 for European Application No. 09774012.0.
(Continued)

Primary Examiner — Hong Kim
(74) Attorney, Agent, or Firm — Dorsey & Whitney LLP

(57) ABSTRACT

Memory device systems, systems and methods are disclosed, such as those involving a plurality of stacked memory device dice and a logic die connected to each other through a plurality of conductors. The logic die serves, for example, as a memory interface device to a memory access device, such as a processor. The logic die can include a command register that allows selective operation in either of two modes. In a direct mode, conventional command signals as well as row and column address signals are applied to the logic die, and the logic die can essentially couple these signals directly to the memory device dice. In an indirect mode, a packet containing a command and a composite address are applied to the logic die, and the logic die can decode the command and composite address to apply conventional command signals as well as row and column address signals to the memory device dice.

26 Claims, 7 Drawing Sheets

(51) Int. Cl.
  *G11C 5/02*         (2006.01)
  *G11C 11/4093*      (2006.01)
  *G11C 11/4096*      (2006.01)
  *G06F 13/16*        (2006.01)

(58) Field of Classification Search
  USPC .............................. 365/163, 230.03; 711/5
  See application file for complete search history.

(56) References Cited

U.S. PATENT DOCUMENTS

| | | |
|---|---|---|
| 5,748,914 A | 5/1998 | Barth et al. |
| 5,774,475 A | 6/1998 | Qureshi |
| 5,960,008 A | 9/1999 | Osawa et al. |
| 5,982,684 A | 11/1999 | Schwartzlow et al. |
| 6,052,329 A | 4/2000 | Nishino et al. |
| 6,122,688 A | 9/2000 | Barth et al. |
| 6,177,807 B1 | 1/2001 | Bertin et al. |
| 6,181,616 B1 | 1/2001 | Byrd |
| 6,247,138 B1 | 6/2001 | Tamura et al. |
| 6,285,211 B1 | 9/2001 | Sample |
| 6,329,859 B1 | 12/2001 | Wu |
| 6,363,017 B2 | 3/2002 | Polney |
| 6,369,627 B1 | 4/2002 | Tomita |
| 6,380,783 B1 | 4/2002 | Chao et al. |
| 6,401,213 B1 | 6/2002 | Jeddeloh |
| 6,418,068 B1 | 7/2002 | Raynham |
| 6,519,194 B2 | 2/2003 | Tsujino et al. |
| 6,570,425 B2 | 5/2003 | Yamaguchi |
| 6,574,626 B1 | 6/2003 | Regelman et al. |
| 6,650,157 B2 | 11/2003 | Amick et al. |
| 6,658,523 B2 | 12/2003 | Janzen et al. |
| 6,839,260 B2 | 1/2005 | Ishii |
| 6,882,304 B2 | 4/2005 | Winter et al. |
| 6,889,334 B1 | 5/2005 | Magro et al. |
| 6,907,555 B1 | 6/2005 | Nomura et al. |
| 7,058,865 B2 | 6/2006 | Mori et al. |
| 7,107,424 B1 | 9/2006 | Avakian et al. |
| 7,135,905 B2 | 11/2006 | Teo et al. |
| 7,149,134 B2 | 12/2006 | Streif et al. |
| 7,168,005 B2 | 1/2007 | Adams et al. |
| 7,171,596 B2 | 1/2007 | Boehler |
| 7,184,916 B2 | 2/2007 | Resnick et al. |
| 7,197,101 B2 | 3/2007 | Glenn et al. |
| 7,203,259 B2 | 4/2007 | Glenn et al. |
| 7,205,811 B2 | 4/2007 | Freyman et al. |
| 7,243,469 B2 | 7/2007 | Miller et al. |
| 7,269,094 B2 | 9/2007 | Lin et al. |
| 7,323,917 B2 | 1/2008 | Cho et al. |
| 7,389,375 B2 | 6/2008 | Gower et al. |
| 7,423,469 B2 | 9/2008 | Pickering et al. |
| 7,466,179 B2 | 12/2008 | Huang et al. |
| 7,489,743 B2 | 2/2009 | Koh et al. |
| 7,567,476 B2 | 7/2009 | Ishikawa |
| 7,697,369 B2 | 4/2010 | Koshizuka |
| 7,710,144 B2 | 5/2010 | Dreps et al. |
| 7,764,564 B2 | 7/2010 | Saito et al. |
| 7,772,907 B2 | 8/2010 | Kim et al. |
| 7,853,836 B2 | 12/2010 | Takada |
| 7,855,931 B2 | 12/2010 | LaBerge et al. |
| 7,979,757 B2 | 7/2011 | Jeddeloh |
| 8,010,866 B2 | 8/2011 | LaBerge |
| 8,127,204 B2 | 2/2012 | Hargan |
| 8,134,876 B2 | 3/2012 | Choi et al. |
| 8,248,138 B2 | 8/2012 | Liu |
| 8,289,760 B2 | 10/2012 | Jeddeloh |
| 8,315,347 B2 | 11/2012 | Canagasaby et al. |
| 8,356,138 B1* | 1/2013 | Kulkarni et al. ............. 711/105 |
| 8,400,808 B2 | 3/2013 | King |
| 8,570,881 B2 | 10/2013 | Talbot et al. |
| 9,275,698 B2 | 3/2016 | LaBerge et al. |
| 2001/0033030 A1 | 10/2001 | Leedy |
| 2002/0004893 A1 | 1/2002 | Chang |
| 2002/0054516 A1 | 5/2002 | Taruishi et al. |
| 2002/0097613 A1 | 7/2002 | Raynham |
| 2002/0125933 A1 | 9/2002 | Tamura et al. |
| 2002/0130687 A1 | 9/2002 | Duesman |
| 2002/0133666 A1 | 9/2002 | Janzen et al. |
| 2002/0138688 A1 | 9/2002 | Hsu et al. |
| 2003/0041299 A1 | 2/2003 | Kanazawa et al. |
| 2003/0132790 A1 | 7/2003 | Amick et al. |
| 2004/0073767 A1 | 4/2004 | Johnson et al. |
| 2004/0098545 A1 | 5/2004 | Pline et al. |
| 2004/0160833 A1 | 8/2004 | Suzuki |
| 2004/0168101 A1 | 8/2004 | Kubo |
| 2004/0199840 A1 | 10/2004 | Takeoka et al. |
| 2004/0206982 A1 | 10/2004 | Lee |
| 2004/0237023 A1 | 11/2004 | Takahashi et al. |
| 2004/0246026 A1 | 12/2004 | Wang et al. |
| 2004/0252689 A1* | 12/2004 | Park et al. ..................... 370/389 |
| 2005/0005230 A1 | 1/2005 | Koga et al. |
| 2005/0071707 A1 | 3/2005 | Hampel |
| 2005/0091471 A1 | 4/2005 | Conner et al. |
| 2005/0144546 A1 | 6/2005 | Igeta et al. |
| 2005/0157560 A1 | 7/2005 | Hosono et al. |
| 2005/0174877 A1 | 8/2005 | Cho et al. |
| 2005/0278490 A1 | 12/2005 | Murayama |
| 2005/0289435 A1 | 12/2005 | Mulla et al. |
| 2006/0028864 A1 | 2/2006 | Rinerson et al. |
| 2006/0036827 A1 | 2/2006 | Dell et al. |
| 2006/0041799 A1 | 2/2006 | Sato |
| 2006/0056247 A1 | 3/2006 | Satoh |
| 2006/0059406 A1 | 3/2006 | Micheloni et al. |
| 2006/0123320 A1 | 6/2006 | Vogt |
| 2006/0126369 A1* | 6/2006 | Raghuram ..................... 365/51 |
| 2006/0233012 A1 | 10/2006 | Sekiguchi et al. |
| 2006/0245291 A1 | 11/2006 | Sakaitani |
| 2006/0253723 A1 | 11/2006 | Wu et al. |
| 2006/0262587 A1 | 11/2006 | Matsui et al. |
| 2006/0273455 A1 | 12/2006 | Williams et al. |
| 2007/0058410 A1 | 3/2007 | Rajan |
| 2007/0070669 A1 | 3/2007 | Tsern |
| 2007/0074093 A1 | 3/2007 | Lasser |
| 2007/0136645 A1 | 6/2007 | Hsueh et al. |
| 2007/0153951 A1 | 7/2007 | Lim et al. |
| 2007/0271424 A1 | 11/2007 | Lee et al. |
| 2008/0080261 A1* | 4/2008 | Shaeffer et al. ......... 365/189.05 |
| 2008/0147897 A1 | 6/2008 | Talbot |
| 2008/0150088 A1 | 6/2008 | Reed et al. |
| 2008/0201548 A1* | 8/2008 | Przybylski et al. .......... 711/171 |
| 2008/0250292 A1 | 10/2008 | Djordjevic |
| 2008/0270842 A1 | 10/2008 | Ho et al. |
| 2009/0006775 A1 | 1/2009 | Bartley et al. |
| 2009/0016130 A1 | 1/2009 | Menke et al. |
| 2009/0021992 A1* | 1/2009 | Oh .......................... 365/189.14 |
| 2009/0091968 A1 | 4/2009 | Dietrich et al. |
| 2009/0196093 A1 | 8/2009 | Happ et al. |
| 2009/0244997 A1 | 10/2009 | Searles et al. |
| 2009/0251189 A1 | 10/2009 | Hsieh |
| 2009/0296867 A1 | 12/2009 | Do et al. |
| 2009/0300314 A1 | 12/2009 | Laberge et al. |
| 2009/0300444 A1 | 12/2009 | Jeddeloh |
| 2010/0005217 A1 | 1/2010 | Jeddeloh |
| 2010/0005376 A1 | 1/2010 | Laberge et al. |
| 2010/0014364 A1 | 1/2010 | Laberge et al. |
| 2010/0031129 A1 | 2/2010 | Hargan |
| 2010/0042889 A1 | 2/2010 | Hargan |
| 2010/0070696 A1 | 3/2010 | Blankenship |
| 2010/0079180 A1 | 4/2010 | Kim et al. |
| 2010/0091537 A1 | 4/2010 | Best et al. |
| 2010/0110748 A1 | 5/2010 | Best |
| 2010/0156488 A1 | 6/2010 | Kim et al. |
| 2010/0176893 A1 | 7/2010 | Nose |
| 2010/0271092 A1 | 10/2010 | Zerbe et al. |
| 2010/0308880 A1 | 12/2010 | Wang et al. |
| 2011/0075497 A1 | 3/2011 | Laberge |
| 2011/0148486 A1 | 6/2011 | Mosalikanti et al. |
| 2011/0271158 A1 | 11/2011 | Jeddeloh |
| 2011/0296227 A1 | 12/2011 | LaBerge et al. |
| 2012/0144276 A1 | 6/2012 | Hargan |
| 2012/0155142 A1 | 6/2012 | King |
| 2013/0208549 A1 | 8/2013 | King |
| 2013/0346722 A1 | 12/2013 | LaBerge et al. |
| 2014/0053040 A1 | 2/2014 | Hargan |

(56) References Cited

U.S. PATENT DOCUMENTS

| | | |
|---|---|---|
| 2014/0258666 A1 | 9/2014 | LaBerge |
| 2014/0298119 A1 | 10/2014 | LaBerge et al. |
| 2014/0337570 A1 | 11/2014 | LaBerge et al. |
| 2015/0028928 A1 | 1/2015 | King |
| 2015/0063043 A1 | 3/2015 | Eckel |
| 2016/0027486 A1 | 1/2016 | Eckel |

FOREIGN PATENT DOCUMENTS

| | | |
|---|---|---|
| JP | 11-102599 | 4/1999 |
| JP | 2004-327474 | 11/2004 |
| JP | 2007-140948 | 6/2007 |
| JP | 2007-226876 | 9/2007 |
| JP | 2007-328636 | 12/2007 |
| JP | 2008-112503 | 5/2008 |
| JP | 2008-140220 | 6/2008 |
| JP | 2010-514080 | 4/2010 |
| WO | 2007028109 A2 | 3/2007 |
| WO | WO-2007/038225 | 4/2007 |
| WO | WO-2007/095080 | 8/2007 |
| WO | WO-2008/054696 | 5/2008 |
| WO | WO 2008/076790 | 6/2008 |
| WO | WO-2009/148863 | 12/2009 |
| WO | 2010/002561 A2 | 1/2010 |
| WO | 2010/011503 A2 | 1/2010 |
| WO | WO-2010/002561 A2 | 1/2010 |
| WO | WO-2010/011503 A2 | 1/2010 |
| WO | WO 2012-060097 | 5/2012 |
| WO | WO-2012/082338 | 6/2012 |

OTHER PUBLICATIONS

Office action received for Chinese application No. 200980125792.2, dated Nov. 2, 2012.
First Office Action and Search Report of Taiwanese Application No. 098120886 dated Apr. 24, 2013.
Decision of Rejection for Japanese Application No. 2011-516419 mailed Jul. 16, 2013.
Extended Search Report for EP Application No. 13157772.8 mailed Jun. 28, 2013.
Notice of Preliminary Rejection issued Mar. 21, 2013 for KR Appln No. 10-2011-7002671.
Office Action dated Nov. 6, 2012 for JP Application No. 2011-516419.
Search Report dated Mar. 11, 2013 for TW Application No. TW 098114848.
Office Action dated Mar. 11, 2013 for TW Application No. 098114848.
2nd Office Action for CN Application 200980125792.2 dated Aug. 29, 2013.
Office Action for TW Appl No. 098121258, issued Dec. 2, 2013.
Preliminary Rejection for KR Appl No. 10-2011-7002671, issued Nov. 28, 2013.
Second Office Action for CN Appl No. 200980128341.4, issued Nov. 19, 2013.
Received Office Action dated Nov. 6, 2012 for JP Application No. 2011-516419.
Extended European Search Report dated Apr. 16, 2015 received for Application No. 09774013.8.
"Fifth Office Action dated May 6, 2015 Issued by the State Intellectual Property Office for Appl. No. 200980128341.4".

\* cited by examiner

| FIELD | BITS | COMMENT |
|---|---|---|
| CMD | 4 | COMMAND FIELD<br><br>0000 NOP<br>0001 CMD EXT1 - READ<br>0010 CMD EXT2 - RESERVED<br>0011 CMD EXT3 - RESERVED<br>0100 CMD EXT4 - WRITE<br>0101 CMD EXT5 - MASKED WRITE<br>0110 CMD EXT6 - RESERVED<br>0111 CMD EXT7 - RESERVED<br><br>1000-1111 - RESERVED |
| UAddress | 28 | UPPER ADDRESS - 36 BITS SUPPORTS 64GBytes PER STACK, MAXIMUM 8 64Gbit DRAM |
| LAddress | 5 | LOWER ADDRESS |
| CMD EXT | 3 | COMMAND EXTENSION<br><br>CMD EXT1 - DECODE READ<br>000 RESERVED<br>001 RESERVED<br>010 RESERVED<br>011 READ 8 BYTE<br>010 READ 16 BYTE<br>010 READ 32 BYTE<br>011 READ 64 BYTE<br>111 READ 128 BYTE<br><br>CMD EXT4 - WRITE<br>000 RESERVED<br>001 RESERVED<br>010 RESERVED<br>011 WRITE 8 BYTE<br>010 WRITE 16 BYTE<br>010 WRITE 32 BYTE<br>011 WRITE 64 BYTE<br>111 WRITE 128 BYTE<br><br>CMD EXT5 - MASKED WRITE<br>000 RESERVED<br>001 RESERVED<br>010 RESERVED<br>011 MASKED WRITE 8 BYTE<br>010 MASKED WRITE 16 BYTE<br>010 MASKED WRITE 32 BYTE<br>011 MASKED WRITE 64 BYTE<br>111 MASKED WRITE 128 BYTE |
| RSV0 | 2 | RESERVED |
| HCRC | 6 | HEADER CRC (CRC-6) - DETECTS A SINGLE LANE FAILURE |
| TAG | 8 | SUPPORTS UP TO 256 OUTSTANDING READS AND OUTSTANDING WRITES. |

FIGURE 6

MULTI-MODE MEMORY DEVICE AND METHOD HAVING STACKED MEMORY DICE, A LOGIC DIE AND A COMMAND PROCESSING CIRCUIT AND OPERATING IN DIRECT AND INDIRECT MODES

CROSS-REFERENCE TO RELATED APPLICATION

This application is a continuation of U.S. patent application Ser. No. 12/166,871, filed Jul. 2, 2008, and issued as U.S. Pat. No. 8,289,760, on Oct. 16, 2012. This application and patent are incorporated by reference herein in their entirety and for any purposes.

TECHNICAL FIELD

Embodiments of the invention relate to memory devices, and, more particularly, in one or more embodiments to a memory device that can be operated in either a direct mode, in which conventional memory control signals are coupled to the memory devices, or an indirect mode, in which command packets are coupled to the memory devices.

BACKGROUND OF THE INVENTION

As memory devices of all types have evolved, continuous strides have been made in improving their performance in a variety of respects. For example, the storage capacity of memory devices has continued to increase at geometric proportions. This increased capacity, coupled with the geometrically higher operating speeds of electronic systems containing memory devices, has made high memory device bandwidth ever more critical. One application in which memory devices, such as dynamic random access memory ("DRAM") devices, require a higher bandwidth is their use as system memory in computer systems. As the operating speed of processors has increased, processors are able to read and write data at correspondingly higher speeds. Yet conventional DRAM devices often do not have the bandwidth to read and write data at these higher speeds, thereby slowing the performance of conventional computer systems. This problem is exacerbated by the trend toward multi-core processors and multiple processor computer systems. It is currently estimated that computer systems operating as high-end servers are idle as many as 3 out of every 4 clock cycles because of the limited data bandwidth of system memory devices. In fact, the limited bandwidth of DRAM devices operating as system memory can reduce the performance of computer systems to as low as 10% of the performance of which they would otherwise be capable.

Various attempts have been made to increase the data bandwidth of memory devices. For example, wider internal data buses have been used to transfer data to and from arrays with a higher bandwidth. However, doing so usually requires that write data be serialized and read data deserialized at the memory device interface. Another approach has been to simply scale up the size of memory devices or conversely shrink their feature sizes, but, for a variety of reasons, scaling has been incapable of keeping up with the geometric increase in the demand for higher data bandwidths.

More recently, proposals have also been made to stack several integrated circuit memory devices in the same package, but doing so threatens to create a large number of other problems that must be overcome. These problems can be solved to a large extent by connecting the stack of interconnected memory devices to a logic die on which the memory devices are stacked. The logic die can then serve as a high-speed interface to the memory devices. However, taking advantage of the increased capabilities of this arrangement is more easily achieved if memory command and address signals are placed in a packet and coupled to the logic die through a high-speed bus. Yet many computer and other systems are designed to interface with memory devices using conventional memory command signals and conventional row and column address signals. Advanced memory systems formed by stacking memory devices on a logic die would therefore be unusable with such systems. However, memory device manufacturers generally desire to standardize their product offerings to the greatest extent possible to lessen the number of different memory devices that are manufactured, marketed, etc.

Therefore, a need exists for a method and system to allow advanced memory system formed by stacking interconnected memory device dice to be interfaced with systems by either using conventional memory commands and addresses or by using packets containing commands and addresses.

BRIEF DESCRIPTION OF THE DRAWINGS

FIG. 6 is a chart showing the commands in the downstream packet of FIG. 4 for the indirect operating mode.

DETAILED DESCRIPTION

Figure 1:
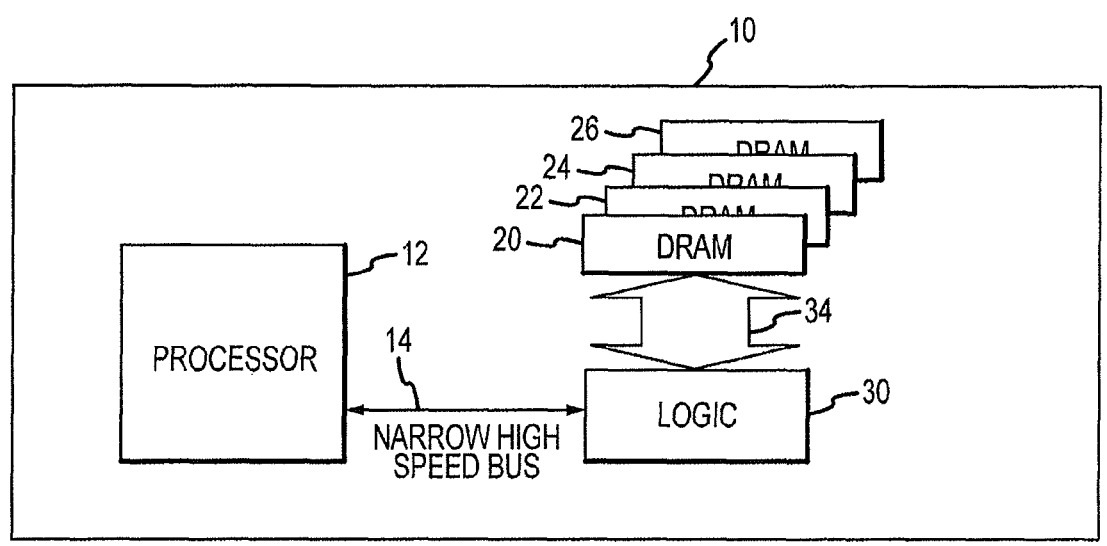
FIG. 1 is a block diagram of a computer system that includes a dual mode memory system according to an embodiment of the invention.

A computer system including a high-capacity, high bandwidth memory device 10 according to an embodiment of the invention is shown in FIG. 1 connected to a processor 12 through a relatively narrow high-speed bus 14 that may be divided into downstream lanes and separate upstream lanes (not shown in FIG. 1). The memory device 10 includes 4 DRAM die 20, 22, 24, 26, which may be identical to each other, stacked on top of each other. Although the memory device 10 includes 4 DRAM die 20, 22, 24, 26, other embodiments of the memory device use a greater or lesser number of DRAM die. The DRAM die 20, 22, 24, 26 are stacked with (e.g., on top of) a logic die 30, which serves as the interface with the processor 12. The logic die 30 can implement a variety of functions in the memory device 10, such as to limit the number of functions that are be implemented in the DRAM die 20, 22, 24, 26. For example, the logic die 30 may perform memory management functions, such as power management and refresh of memory cells in the DRAM die 20, 22, 24, 26. In some embodiments, the logic die 30 may implement test and/or repair capabilities, and it may perform error checking and correcting ("ECC") functions.

The DRAM die 20, 22, 24, 26 are connected to each other and to the logic die 30 by a relatively wide bus 34. The bus 34 may be implemented with through silicon vias ("TSVs"), which comprise a large number of conductors extending through the DRAM die 20, 22, 24, 26 at the same locations on the DRAM die and connect to respective conductors formed on the die 20, 22, 24, 26. In one embodiment, each of the DRAM die 20, 22, 24, 26 are divided into 16 autonomous partitions, each of which may contain 2 or 4 independent memory banks. In such case, the partitions of each die 20, 22, 24, 26 that are stacked on top of each other may be independently accessed for read and write operations. Each set of 16 stacked partitions may be referred to as a "vault." Thus, the memory device 10 may contain 16 vaults.

Figure 2:
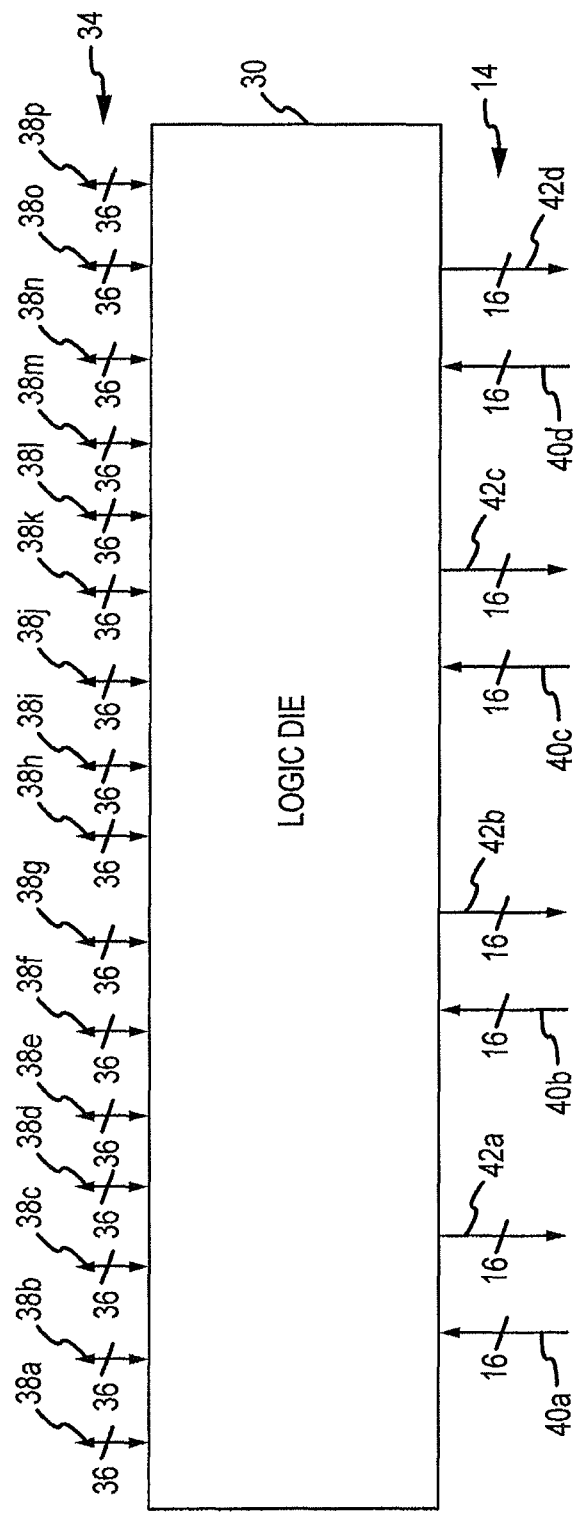
FIG. 2 is a block diagram of a dual mode memory system according to an embodiment of the invention.

As shown in FIG. 2, in one embodiment, the bus 34 may be divided into 16 36-bit bi-directional sub-buses 38a-p, with each of the 16 36-bit sub-buses coupled to the 4 partitions in a respective vault. Each of these sub-buses couples 32 bits of a data and 4 ECC bits between the logic die 30 and the DRAM die 20, 22, 24, 26. However, the number of stacked DRAM die 20, 22, 24, 26, the number of partitions in each DRAM die, the number of banks in each partition, and the number of bits in each of the sub-buses 38a-p can vary as desired. The relatively narrow high-speed bus 14 connecting the processor 12 to the logic die may be divided into 4 16-bit downstream lanes 40a-d and 4 separate 16-bit upstream lanes 42a-d. The 4 downstream lanes 40a-d may be connected to a single processor 12 as shown in FIG. 1, which may be a multi-core processor, to multiple processors (not shown), or to some other memory access device like a memory controller. The 4 downstream lanes 40a-d may operate independently of each other so that packets (in the indirect mode) or memory command, address, and data signals (in the direct mode) are coupled through the lanes 40a-d at different times and to the same or different vaults.

As explained in greater detail below, one of the functions performed by the logic die 30 can be to serialize the read data bits coupled from the DRAM die 20, 22, 24, 26 into a serial stream of 16 serial data bits coupled through 16 parallel bits of each upstream lane 42a-d of the bus 14. Similarly, the logic die 30 may perform the functions of deserializing 16 serial data bits coupled through one of the 16-bit downstream lanes 40a-d of the bus 14 to obtain 256 parallel data bits. The logic die 30 then couples these 256 bits through one of the 32-bit sub-buses 38a-p in a serial stream of 8 bits. However, other embodiments may use different numbers of lanes 40, 42 having different widths or different numbers of sub-buses 38a-p having different widths, and they may couple data bits having different structures. As will be appreciated by one skilled in the art, the stacking of multiple DRAM die results in a memory device having a very large capacity. Further, the use of a very wide bus connecting the DRAM die allows data to be coupled to and from the DRAM die with a very high bandwidth.

Figure 3:
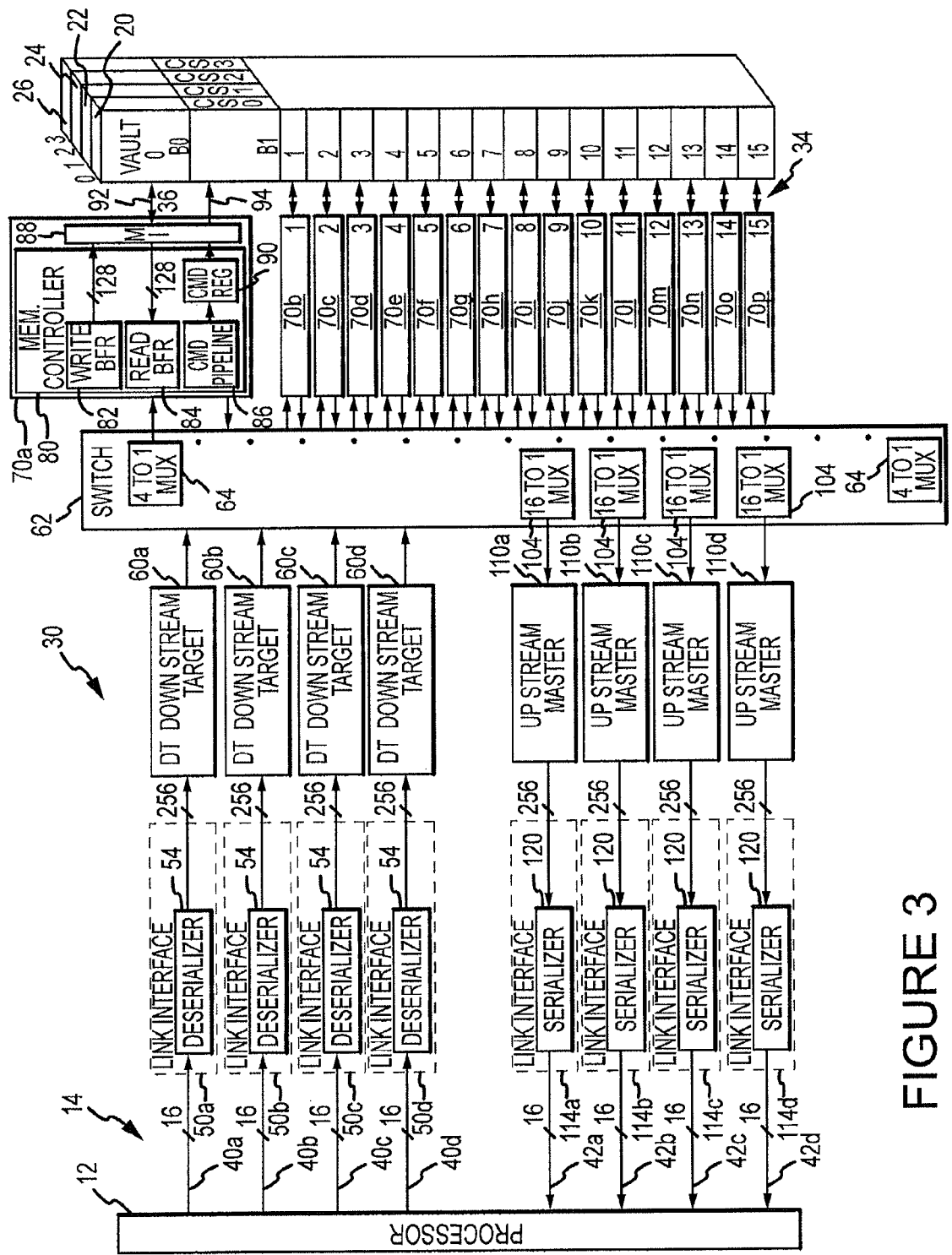
FIG. 3 is a more detailed block diagram of a dual mode memory system according to an embodiment of the invention.

A logic die 30 according to an embodiment of the invention is shown in FIG. 3 connected to the processor 12 and the DRAM die 20, 22, 24, 26. As shown in FIG. 3, each of the 4 downstream lanes 40a-d may be connected to a respective link interface 50a-d. Each link interface 50a-d includes a deserializer 54 that converts each serial stream of 16 data bits on each of the 16-bit lanes 40a-d to 256 parallel bits. Insofar as there are 4 link interfaces 50a-d, the link interfaces can together output 1024 output parallel bits.

Each of the link interfaces 50a-d applies its 256 parallel bits to a respective downstream target 60a-d, which decodes the command and address portions of the received packet (in the indirect mode) or the commands and addresses (in the direct mode) and buffers write data in the event a memory request is for a write operation. The downstream targets 60a-d output their respective commands, addresses and possibly write data to a switch 62. The switch 62 contains 16 multiplexers 64 each of which direct the command, addresses and any write data from any of the downstream targets 60a-d to its respective vault of the DRAM die 20, 22, 24, 26. Thus, each of the downstream targets 60a-d can access any of the 16 vaults in the DRAM die 20, 22, 24, 26. The multiplexers 64 use the address in the received memory requests to determine if its respective vault is the target of a memory request. Each of the multiplexers 64 apply the memory request to a respective one of 16 vault controllers 70a-p.

Each vault controller 70a-p includes a respective memory controller 80, each of which includes a write buffer 82, a read buffer 84 and a command pipeline 86. The commands and addresses in memory requests received from the switch 62 are loaded into the command pipeline 86, which subsequently outputs the received commands and corresponding addresses. Any write data in the memory requests are stored in the write buffer 82. The read buffer 84 may be used to store read data from the respective vault, as will be explained in greater detail below. The write data from the write buffer 82 are applied to a memory interface 88.

According to an embodiment of the invention, the commands and addresses from the command pipeline 86 are applied to a memory interface 88 through a command processing circuit, such as a command register 90. The command register 90 can be a free running interface register. In the direct mode, the commands and addresses from the command pipeline are applied to the memory interface 88. These commands and addressed may be applied to the memory interface 88 as they are received by the memory device 10. In the indirect mode, the command register 90 creates the commands and addresses and sends it to the memory interface 88. The command register 90 includes a sequencer (not shown) that transmits the commands and addresses to the memory interface in the proper order and at the proper times.

The memory interface 88 couples the received command and address signals from the command register 90 to the DRAM die 20, 22, 24, 26 through a command/address bus 92. The memory interface 88 also couples 32-bits of write data from the write buffer 82. In some embodiments, the memory interface 88 may include an ECC system (not shown), which uses ECC techniques to check and correct the data read from the DRAM die 20, 22, 24, 26. In such case, in addition to coupling write data to the DRAM die 20, 22, 24, 26, the memory interface 88 couples 4 bits of ECC from the ECC system to the DRAM die 20, 22, 24, 26 through a 36-bit data bus 94.

Although write data are loaded into the write buffer 82 as 256 parallel bits, they are output from the buffer 82 in two sets, each set being 128 parallel bits. These 128 bits may then be further serialized by the ECC system (not shown) to 4 sets of 32-bit data, which are coupled through the data bus 94. In the embodiment shown in FIG. 3, write data are coupled to the write buffer 82 in synchronism with a 500 MHz clock so the data are stored in the write buffer at 16 gigabytes ("GB") per second. The write data are coupled from the write buffer 82 to the DRAM die 20, 22, 24, 26 using a 2 GHz clock so the data are output from the write buffer 82 at 8 GB/s. Therefore, as long as more than half of the memory requests are not write operations to the same vault, the write buffers 82 will be able to couple the write data to the DRAM die 20, 22, 24, 26 at least as fast as the data are coupled to the write buffer 82.

In the event a memory request is for a read operation, the command and address for the request are coupled to the DRAM die 20, 22, 24, 26 in the same manner as a write request, as explained above. In response to a read request, 32 bits of read data and 4 ECC bits are output from the DRAM die 20, 22, 24, 26 through the 36-bit data bus 94. The ECC bits are passed to the ECC system (not shown), which uses the ECC bits to check and correct the read data before passing the read data on to the read buffer 84. The ECC system also deserializes the 32 bits of read data into two sets of 128-bit read data. However, in some embodiments, the memory system does not include the ECC system.

After 2 sets of 128-bit read data have been stored in the read buffer 84, the read buffer transmits 256 bits to the switch 62. The switch includes 4 output multiplexers 104 coupled to respective upstream masters 110a-d. Each multiplexer 104 can couple 256 bits of parallel data from any one of the vault controllers 70a-p to its respective upstream master 110a-d. The upstream masters 110a-d format the 256 bits of read data into packet data (in the indirect mode) and couple the packet to respective upstream link interfaces 114a-d. In the direct mode, the read data are simply coupled to respective upstream link interfaces 114a-d. Each of the link interfaces 114a-d include a respective serializer 120 that converts the incoming 256 bits to a serial stream of 16 bits on each bit of a respective one of the 16-bit upstream links 42a-d.

Figure 4:
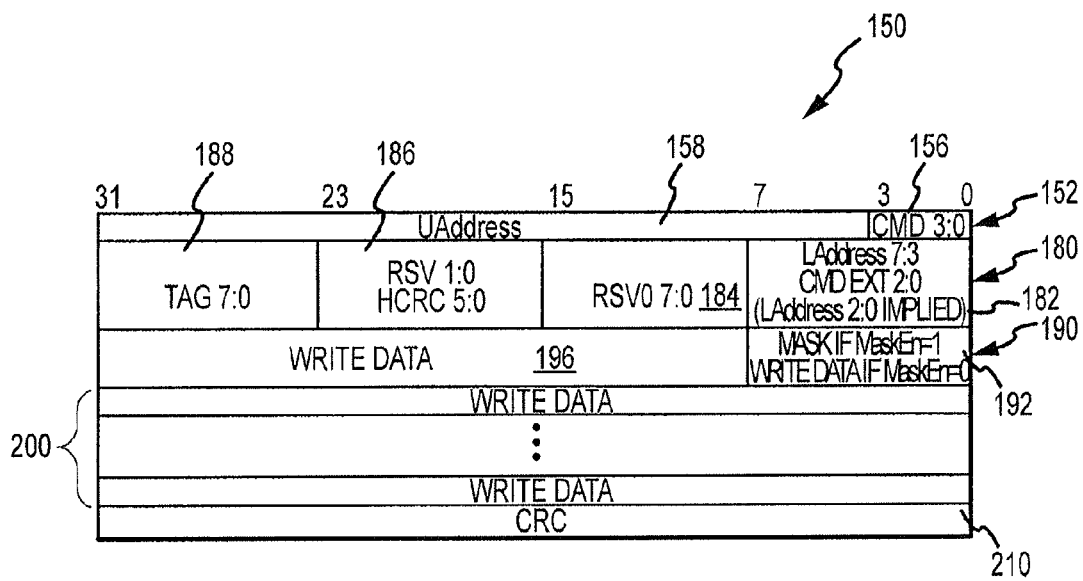
FIG. 4 is a packet diagram showing the format of a downstream packet that can be coupled to the memory system of FIG. 1, 2 or 3 or a memory system according to some other embodiment of the invention for the indirect operating mode.

The format of a downstream packet 150 that can be coupled to the memory system of FIG. 1, 2 or 3 or a memory system according to some other embodiment of the invention is shown in FIG. 4. The downstream packet 150 may be, as explained above, 32 bits wide, and it contains a first field 152. In the indirect operating mode, the first field 152 includes a 4-bit command 156 ("Cmd 3:0"), and 28 bits of an upper address 158 ("UAddress"). The nature of the command 156 and upper address 158 will be described in connection with FIG. 6.

Figure 5:
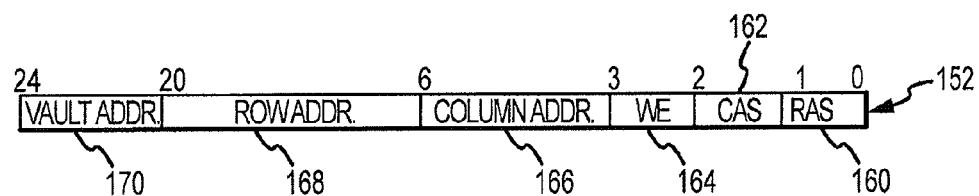
FIG. 5 is a chart showing how the commands in the first field of the downstream packet of FIG. 4 are modified for the direct operating mode.

As shown in FIG. 5, in the direct mode, the first field 152 of the downstream packet 150 may be modified to allow a memory access device to directly access the DRAM die 20, 22, 24, 26. The first bit of the first field 152 may be a row address strobe ("RAS") signal 160, the second bit may be a column address strobe ("CAS") signal 162 and the third bit may be a write enable ("WE") signal 164. The first field 152 also includes a 4-bit column address 166 and a 14-bit row address 168. Finally, the first field 152 includes a four bit vault address 170. The vault address 170 specifies which of the 16 vaults are being accessed.

Returning to FIG. 4, the downstream packet 150 also contains a second field 180, which may be used in the indirect operating mode. The second field 180 contains a first group of 8 bits 182 that include 3-bit command extension ("Cmd Ext") and 5 bits of a lower address ("LAddress"). As subsequently explained, the Cmd Ext bits 182 are used to further define commands designated by the four command bits 156. The next eight bits 184 of the second field 180 are reserved. The next eight bits 186 include 2 reserved bits ("RSV") and 6 header error checking and correcting bits ("HCRC"), which allow errors in the first field 152 to be detected and possibly corrected. A final eight bits 188 of the second field 180 are tag bits ("Tag") which uniquely identifies each memory request. As explained in greater detail below, these Tag bits 188 are included in upstream packets containing read data so that the memory request to which the read data corresponds can be identified, for example. Also, including these Tag bits 188 in an upstream packet for a write allows the writing of data to be acknowledged in an upstream packet, as will be subsequently explained.

The downstream packet 150 also contains a third field 190, which includes a mask bit 192 that specifies whether a write will be masked, and 31 bits of write data 196. Following the third field 190 are one or more fields of write data 200. A final field contains a set of error checking bits 210, which may be cyclic redundancy check ("CRC") bits, ECC bits or some other type of error checking bits. The error checking bits 210 correspond to the write data to allow the memory system to determine if there were any errors in the transmission of the write data. In the case where the error checking bits are ECC bits and the number of errors is not too great, the bits 210 may allow errors in the write data to be corrected.

Potential commands corresponding to the 4 command bits 156 in the first field 152 are shown in FIG. 6 for the indirect mode. For the direct mode, the memory commands are formed by combinations of the WE, CAD and RAS signals shown in FIG. 5. As shown in FIG. 6, Cmd "0000" is for a no operation ("NOP") command, which does not cause the memory system 10 to perform any memory access. The command "0001" is decoded as a read command, with the number of bytes in the read being designated by the command extension bits 182. The command "0100" is decoded as a write command, with the number of bytes being written again by the command extension bits 182. Finally, the command "0101" is decoded as a masked write command, with the number of bytes also being written by the command extension bits 182. The remaining commands in the Cmd bits 156 are reserved for implementing additional functions.

With further reference to FIG. 6, the 28-bit upper address 158 and the 5-bit lower address in the bit group 182 specify the location in the memory system that is the subject of the memory request. The logic die 30 uses these address bits to route a memory request to the corresponding vault and the corresponding row and column address in that vault. As mentioned above, the command extension "Cmd Ext" in the group 182 specifies the number of bytes that are read or written for a read and write or a masked write. If the command 156 in the first field 152 was for a read, the command extensions "011" through "111" designate a read request of 8 through 128 bytes. The remaining command extensions are used for implementing additional functions. If the command 156 in the first field 152 was for a write, the command extensions "011" through "111" similarly designate a write request of 8 through 128 bytes. Finally, if the command 156 in the first field 152 was for a masked write, the command extensions "011" through "111" designate a masked write request of 8 through 128 bytes. The remaining command extensions are used for implementing additional functions.

As also shown in FIG. 6, the 6 error checking bits "HCRC" in the group 186 detects whether the data in the first field 152 contains an error. The final 8-bit tag 188 uniquely identifies each memory request, as previously explained.

Figure 7:
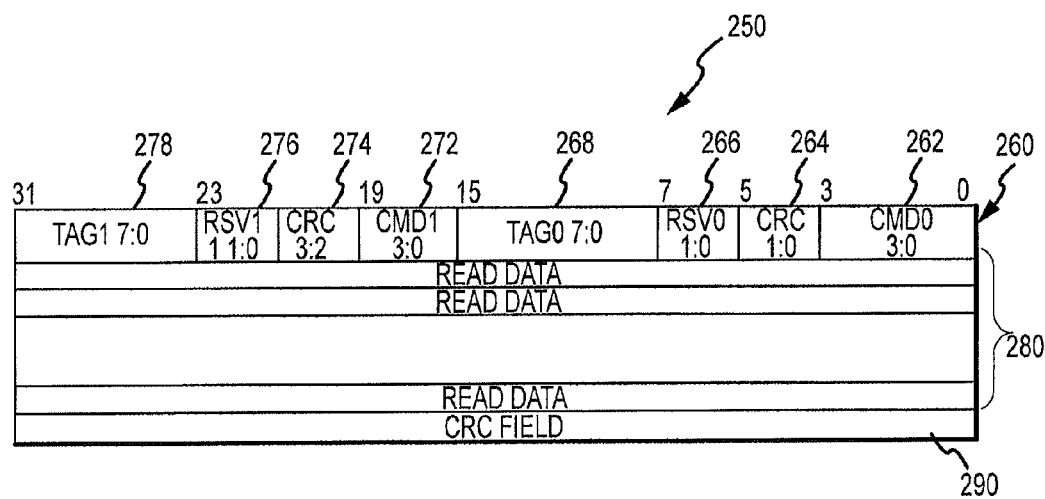
FIG. 7 is a packet diagram showing the format of an upstream packet that can be coupled from the memory system of FIG. 1, 2 or 3 or a memory system according to some other embodiment of the invention.

The format of an upstream packet 250 is shown in FIG. 7. A first field 260 of the upstream packet 250 includes a 4-bit command ("Cmd0") 262, and 2 error checking bits 264. Next are 2 reserved bits 266 followed by the 8-bit tag 268 ("Tag0"), which, as previously explained, corresponds to the tag in the downstream packet 150 to which the read data is responsive. The first field 260 also contains a second set of the above-described bits, namely a 4-bit command ("Cmd1") 272, and 2 error checking bits 274. These error checking bits 274, along with the 2 error checking bits 264, allow detection and possibly correction of errors in the 32 bits of the first field 260. The first field 260 also contains 2 reserved bits 276, and an 8-bit tag 278 ("Tag1"). The upstream packet 250 normally does not include read data for two memory requests. However, the ability to include a second tag 278 and command 272, etc. in the first field 260 allows a write request to be acknowledged in the same upstream packet 250 as an upstream packet containing read data and an associated tag. Following the first field 260 are one or more 32-bit fields 280 of read data and a 32-bit field 290 of error checking bits. These error checking bits allow a memory controller or other memory access device receiving the read data to check for and possibly correct any transmission errors in the read data.

Figure 8:
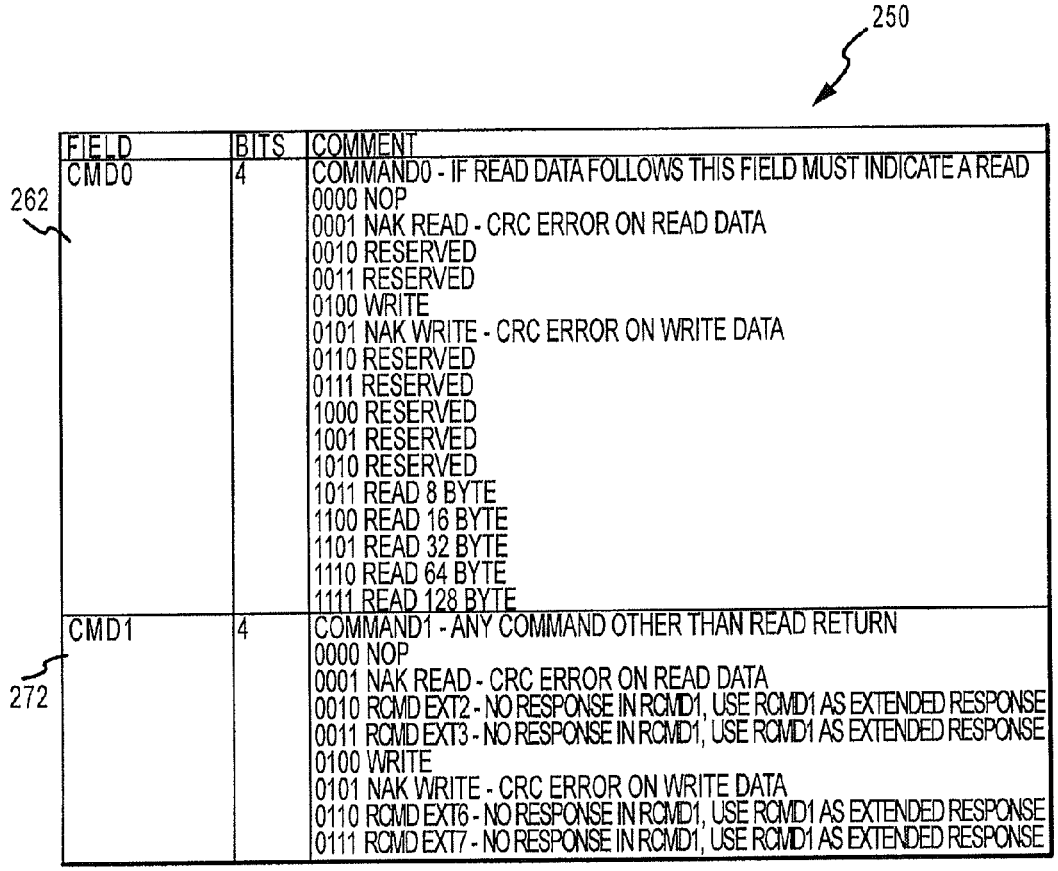
FIG. 8 is a chart showing the commands in the upstream packet of FIG. 7 for the indirect operating mode.

The commands corresponding to the Cmd bits 262, 272 in the upstream packet 250 are shown in FIG. 8. The 4-bit command "Cmd0" 262 corresponds to a read if the upstream packet 250 is to contain read data. Again, the command "0000" is for a no operation "NOP" command. The next command "0001" is a naked command ("NAK") that acknowledges a read memory request but indicates that the data could not be read because of an error. The command "0100" acknowledges a prior write request, and the command "0101" is a naked command that acknowledges a prior write request but indicates that the write data was in error. The commands "1011" through "1111" indicates the upstream packet 250 contains read data of 8, 16, 32, 64 or 128 bytes, respectively. The remaining commands of "Cmd0" are reserved for implementing other features.

The commands corresponding to the Cmd1 bits 272 are also shown in FIG. 8. The command "0000" is again for a no operation "NOP" command, and the command "0001" is again a naked command ("NAK") that acknowledges a read memory request but indicates that the data could not be read because of an error. The command "0100" acknowledges a prior write request, and the command "0101" is a naked command that acknowledges a prior write request but indicates that the write data was in error. The remaining commands of "Cmd1" are reserved for implementing other features.

From the foregoing it will be appreciated that, although specific embodiments of the invention have been described herein for purposes of illustration, various modifications may be made without deviating from the spirit and scope of the invention. For example, although the embodiments of the invention are explained in the context of stacked DRAM die, it will be understood that the stacked die may be other types of memory device dice, such as flash memory device dice. Accordingly, the invention is not limited except as by the appended claims.

What is claimed is:

1. A memory device system comprising:
    a plurality of stacked memory device dice connected to each other through a plurality of conductors, a memory device dice of the plurality of stacked memory device dice comprising a plurality of memory cells;
    a logic die coupled to the plurality of stacked memory device dice through a plurality of conductors, the logic die being configured to write data to and read data from the plurality of stacked memory device dice responsive to one or more received packets, the logic die including a command processing circuit, the command processing circuit configured to receive the one or more packets and configured to selectively operate in at least one of a first mode and a second mode, wherein in the first mode, the command processing circuit is configured to interpret a position of bits of a field of a packet of the one or more packets as a row address strobe signal and a column address strobe signal, and wherein in the second mode, the command processing circuit is configured to interpret the position of bits of the field of the packet as at least a portion of a command code.

2. The memory device system of claim 1, wherein the command processing circuit is further configured to, in the second mode, provide memory commands and memory addresses to the at least one of the plurality of stacked memory device dice based on the command code.

3. The memory device system of claim 2, wherein the memory commands are different than the command code.

4. The memory device system of claim 1, wherein the command processing circuit is further configured to, in the first mode, provide the row address strobe signal and the column address strobe signal to the at least one of the plurality of stacked memory device dice based on the command code.

5. The memory device system of claim 1, wherein in the first mode, the bits of the field further correspond to a write enable signal.

6. The memory device system of claim 1, wherein, in the first mode, the command processing circuit is configured to provide data corresponding to the one or more packets in to the plurality of stacked memory dice in an order the one or more packets are received at the command processing circuit.

7. The memory device system of claim 1, wherein, in the second mode, the command processing circuit is configured to provide data corresponding to the one or more packets in to the plurality of stacked memory dice based on a preset order.

8. The memory device system of claim 7, wherein, in the second mode, the preset order is different than an order the one or more packets are received at the command processing circuit.

9. The memory device system of claim 1, wherein the first mode is a direct mode and the second mode is an indirect mode.

10. The memory device system of claim 2, wherein the first mode is a direct mode and the second mode is an indirect mode.

11. A system comprising:
    a plurality of stacked memory device dice connected to each other through a plurality of conductors, a memory device dice of the plurality of stacked memory device dice memory device dice comprising a plurality of memory cells having locations corresponding to respective memory addresses; and
    a logic die coupled to the plurality of stacked memory device dice, the logic die configured to receive one or more packets, the logic die further configured to selectively operate in at least one of a first mode and a second mode, wherein, in the first mode, the logic die is configured to interpret a position of bits of a field of a packet of the one or more packets as a row address strobe signal and a column address strobe signal, respectively and to apply a first set of commands to the plurality of stacked memory device dice based on the row address strobe signal and the column address strobe signal, and wherein, in the second mode, the logic die is configured to interpret the position of bits of the field of the packet as at least a portion of a command code and to apply a second set of commands to the plurality of stacked memory device dice based on the command code.

12. The system of claim 11, wherein the logic die comprises a command register configured to, in the first mode, receive the packet and to couple a memory device dice of the plurality of stacked memory device dice to the row address strobe signal and the column address strobe signal.

13. The system of claim 12, wherein the field further comprises bits corresponding to a write enable signal, and wherein the command register is further configured to, in the first mode, couple the memory device dice of the plurality of stacked memory device dice to the write enable signal.

14. The system of claim 12, wherein the command register further is configured to, in the in the second mode, receive the packet and provide a memory packet to the memory device dice of the plurality of stacked memory device dice based on the command code.

15. The system of claim 14, wherein the memory device dice is configured to, in the in the second mode, receive the memory packet and to determine a memory address responsive to data of the packet.

16. The system of claim 14, wherein the logic die is configured to operate in the first mode and in the second mode contemporaneously.

17. The system of claim 11, further comprising a memory access device configured to provide the one or more packets to the logic die.

18. The system of claim 11, wherein the first mode is a direct mode and the second mode is an indirect mode.

19. A method comprising:
receiving one or more packets at a logic die of a memory system, the logic die configured to selectively operate in at least one of a first mode or a second mode;
in response to a packet of the one or more packets received by the logic die, interpreting, in a first mode, a position of bits of a field of a packet of the one or more packets as a row address strobe signal and a column address strobe signal;
coupling, in the first mode, the a row address strobe signal and the column address strobe signal to a memory device dice of a plurality of stacked memory device dice of the memory system;
interpreting, in a second mode, the position of bits of the field of the packet as at least a portion of a command code;
determining, in the second mode, a memory command signal and an address signal based on the command code; and
providing, in the second mode, the memory command signal and the memory address signal to the memory device dice of a plurality of stacked memory device dice of the memory system based on the command code.

20. The method of claim 19, further comprising determining, in the first mode, a write enable signal based on corresponding bits of the field of the packet.

21. The method of claim 19, further comprising storing, in the first mode, data in the memory device dice based on a command signal, the row address strobe signal, and the column address strobe signal.

22. The method of claim 21, further comprising storing, in the second mode, the data in the memory device dice based on the memory command signal and the memory address signal.

23. The method of claim 19, further comprising receiving, in the first mode, data from the memory device dice based on a command signal, the row address strobe signal, and the column address strobe signal.

24. The method of claim 23, further comprising receiving, in the second mode, the data from the memory device dice based on the memory command signal and the memory address signal.

25. The method of claim 23, wherein the command signal, the row address strobe signal, and the column address signal have a different format than the memory command signal and the memory address signal.

26. The method of claim 19, wherein the first mode is a direct mode and the second mode is an indirect mode.

* * * * *

UNITED STATES PATENT AND TRADEMARK OFFICE
CERTIFICATE OF CORRECTION

| | |
|---|---|
| PATENT NO. | : 9,659,630 B2 |
| APPLICATION NO. | : 13/619682 |
| DATED | : May 23, 2017 |
| INVENTOR(S) | : Joseph M. Jeddeloh |

It is certified that error appears in the above-identified patent and that said Letters Patent is hereby corrected as shown below:

In the Claims

| | Delete | Insert |
|---|---|---|
| Column 8, Line 55 Claim 11 | "dice memory device dice comprising" | --dice comprising-- |
| Column 9, Line 19 Claim 14 | "in the in the second mode," | --in the second mode,-- |
| Column 9, Line 24 Claim 15 | "in the in the second mode," | --in the second mode,-- |
| Column 9, Line 40 Claim 19 | "in a first mode" | --in the first mode-- |
| Column 10, Line 1 Claim 19 | "the a row address" | --the row address-- |

Signed and Sealed this
Twenty-ninth Day of May, 2018

Andrei Iancu
*Director of the United States Patent and Trademark Office*